United States Patent [19]

Kurono et al.

[11] Patent Number: 5,779,803
[45] Date of Patent: Jul. 14, 1998

[54] PLASMA PROCESSING APPARATUS

[75] Inventors: Yoichi Kurono, Yamanashi-ken; Shigeki Tozawa, Nirasaki; Shozo Hosoda, Yamanashi-ken, all of Japan

[73] Assignees: Tokyo Electron Limited, Tokyo; Tokyo Electron Yamanashi Limited, Nirasaki, both of Japan

[21] Appl. No.: 696,224

[22] Filed: Aug. 13, 1996

Related U.S. Application Data

[62] Division of Ser. No. 363,270, Dec. 23, 1994, Pat. No. 5,578,164.

[30] Foreign Application Priority Data

Dec. 24, 1993 [JP] Japan .................................. 5-347386
Dec. 28, 1993 [JP] Japan .................................. 5-352895

[51] Int. Cl.$^6$ ................................................. C23C 16/00
[52] U.S. Cl. ............................. 118/723 R; 118/723 E; 156/345
[58] Field of Search ................. 118/723 R, 723 E, 118/723 I; 156/345; 204/298.02, 298.31

[56] References Cited

U.S. PATENT DOCUMENTS 5,350,479  9/1994  Collins et al. ....................... 156/345
5,356,515  10/1994  Tahara et al. ....................... 156/643.1
5,459,632  10/1995  Birang et al. ........................ 361/234
5,560,804  10/1996  Higuchi et al. ..................... 156/643.1

*Primary Examiner*—R. Bruce Breneman
*Assistant Examiner*—Luz Alejandro
*Attorney, Agent, or Firm*—Oblon, Spivak, McClelland, Maier & Neustadt, P.C.

[57] ABSTRACT

An apparatus for subjecting a semiconductor wafer having an uncovered marginal portion, from which a photoresist film is removed, to an anisotropic etching. The apparatus comprises a process chamber which can be set to a vacuum. Upper and lower electrodes opposite to each other are provided in the process chamber. An etching gas is made into plasma between these electrodes. An electrostatic chuck is arranged on the lower electrode. A wafer is mounted on the electrostatic chuck. A ring made of dielectric material, movable upward and downward, is arranged between the electrodes. A central portion of the ring is formed as a hood having a recessed shape corresponding to the marginal portion of the wafer. During the etching, the hood covers the marginal portion of the wafer under a plasma sheath, so as to be out of contact with the wafer, thereby preventing the marginal portion of the wafer from being etched.

13 Claims, 4 Drawing Sheets

F I G. 4
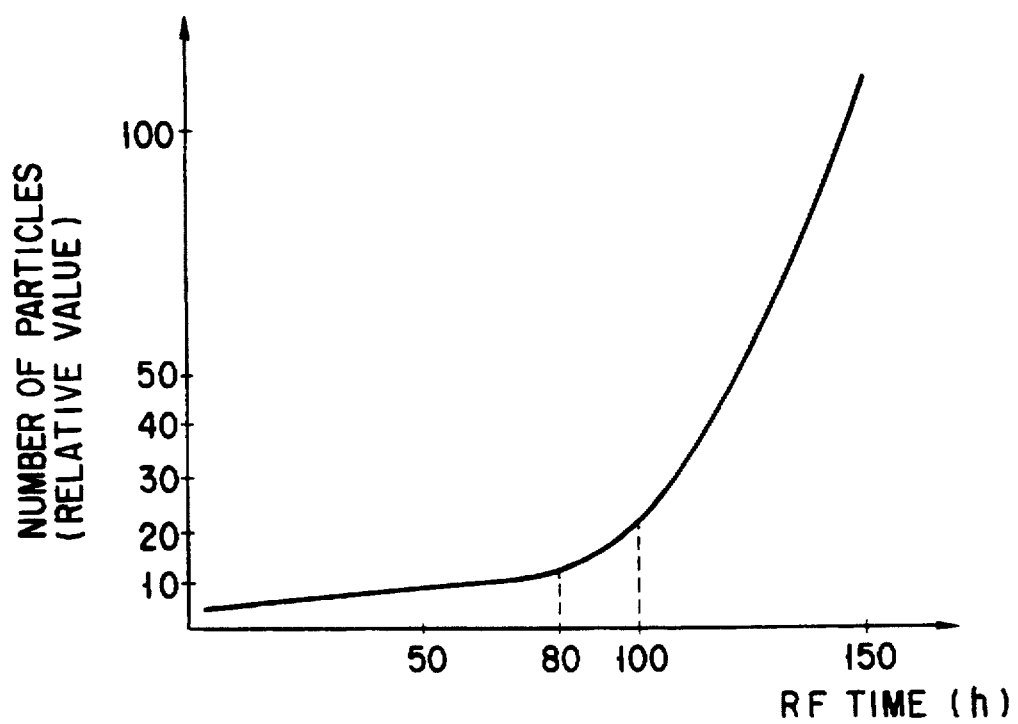
F I G. 5

PLASMA PROCESSING APPARATUS

This is a Division of application Ser. No. 08/363,270 filed Dec. 23, 1994, now U.S. Pat. No. 5,578,164.

BACKGROUND OF THE INVENTION

1. Field of the Invention

The present invention relates generally to a plasma processing apparatus and method, and more particularly to an apparatus and method for processing with plasma a semiconductor wafer or an LCD substrate having an uncovered marginal portion on which a photoresist film has been removed.

2. Description of the Related Art

A plasma etching apparatus is known as a processing apparatus, used in processes of manufacturing semiconductor devices, for making gas into plasma and processing a substrate, such as a semiconductor wafer or an LCD substrate, with the plasma.

Jpn. Pat. Appln. KOKAI Publication No. 63-300517 discloses a plasma etching apparatus. According to this publication, a wafer is held by an electrostatic chuck having a diameter greater than that of the wafer and etched by plasma. When a wafer supporting surface of the electrostatic chuck is formed of a polyimide resin, an uncovered portion of the supporting surface is etched by plasma and the lifetime of the electrostatic chuck is reduced.

When a wafer, on which a photoresist film is formed, is subjected to a photolithography process as disclosed in Jpn. Pat. Appln. KOKAI Publication No. 1-196026, a marginal portion of the wafer is exposed to light and the resist film on that portion is removed. The process of exposing the marginal portion is performed to prevent generation of particles, which may be generated from the resist film in the marginal portion, when the wafer is handled, e.g., transferred.

However, when the wafer is etched by the plasma etching apparatus as described above after the process of exposing the marginal portion, the marginal portion of the wafer is also etched. If the marginal portion is etched, it may be broken or damaged when the wafer is transferred after the etching.

If the marginal portion becomes rugged due to the etching, particles are trapped in the rugged portion when the wafer is transferred. The trapped particles are dispersed in a process chamber, in which a next process is performed, and adhere to a wafer. As a result, the manufacturing yield is lowered.

If the plasma processing apparatus is a CVD film-forming apparatus, a film adheres to the uncovered marginal portion of the wafer. The film is broken or damaged when the wafer is transferred by transfer means, and dispersed as particles.

SUMMARY OF THE INVENTION

An object of the present invention is to provide a plasma processing apparatus and method, for suitably processing a substrate, such as a semiconductor wafer or an LCD substrate, having an uncovered marginal portion due to a marginal exposing process or the like, so as to prevent problems such as generation of particles.

According to a first aspect of the present invention, there is provided an apparatus for subjecting a substrate to a plasma process, the substrate having a portion on which a patterned mask film is formed and a marginal portion which is not covered with the mask film, the apparatus comprising:

a process chamber;

a supply for supplying a process gas to the process chamber;

an exhaust for exhausting and setting the process chamber to a vacuum;

a work table, arranged in the process chamber, having a supporting surface on which the substrate is mounted and an electrostatic chuck for attracting and holding the substrate on the supporting surface;

a plasma generator for making the process gas into a plasma at a position opposite to the supporting surface and in the process chamber, the plasma having a plasma sheath opposite to the supporting surface; and a hood arranged between the substrate mounted on the supporting surface and the plasma sheath, the hood covering but being out of contact with the marginal portion of the substrate so as to prevent the marginal portion from being subjected to the plasma process.

According to a second aspect of the present invention, there is provided a method of subjecting a substrate to a plasma process, comprising:

a preparatory step of forming a photoresist film on the substrate substantially entirely and exposing and developing the photoresist film, so as to form a patterned resist mask film, the substrate having a marginal portion which is not covered by the resist mask film; and a main step, subsequent to the preparatory step, for subjecting the substrate to the plasma process by means of the plasma processing apparatus according to the first aspect, the main step comprising the steps of:
(i) introducing the substrate into the process chamber, mounting it on the supporting surface and attracting and holding it with the electrostatic chuck;
(ii) covering the marginal portion of the substrate by the hood so as to be out of contact with each other;
(iii) supplying the process gas to the process chamber, making the process gas into the plasma, and subjecting the substrate to the plasma process, using the plasma, wherein the hood prevents the marginal portion from being subjected to the plasma process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a schematic cross-sectional view showing a semiconductor wafer processed by the apparatus and method of the present invention;

FIG. 5 is a graph showing the relationship between a process time and the number or particles.

DETAILED DESCRIPTION OF THE PREFERRED EMBODIMENT

Figure 1:
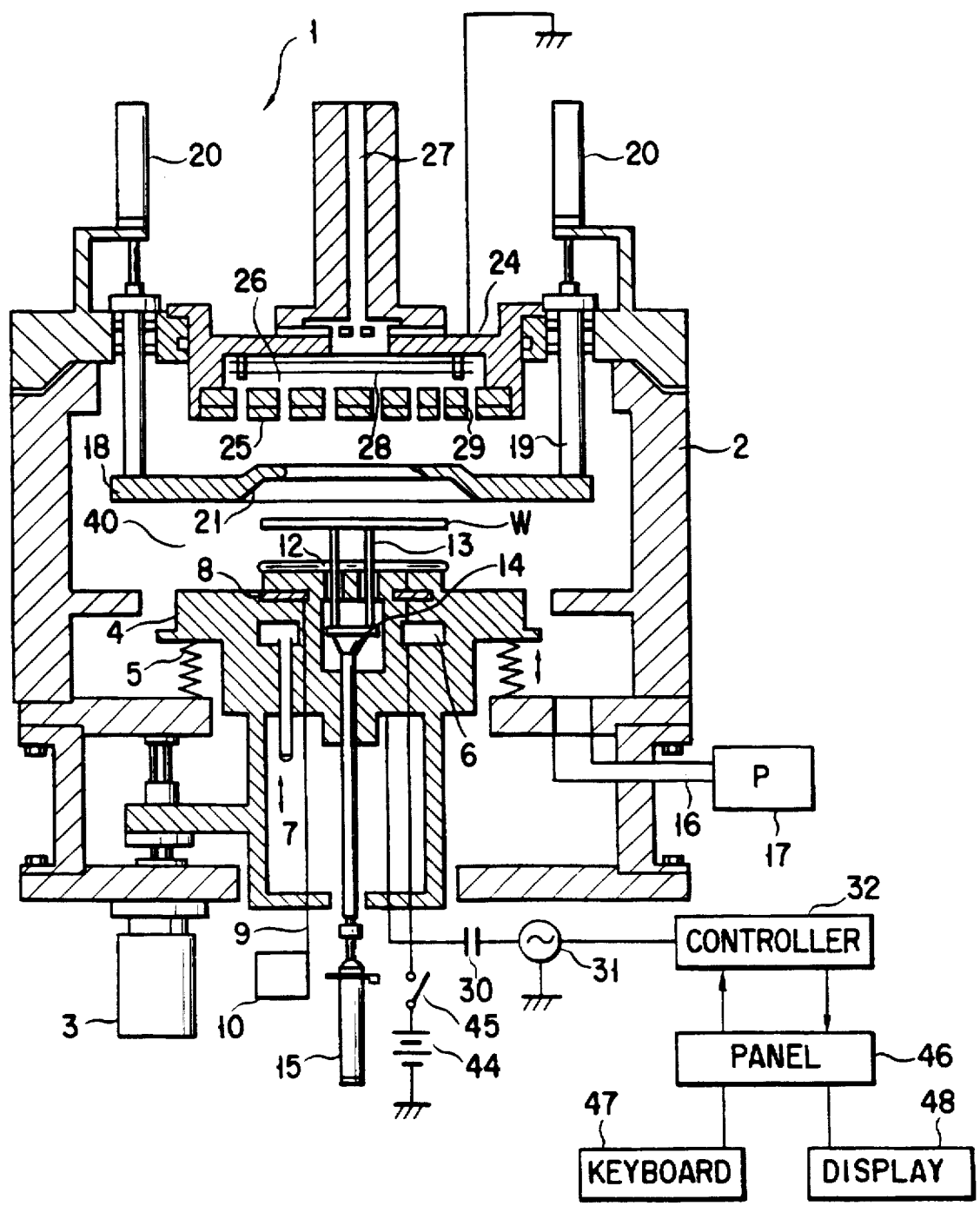
FIG. 1 is a cross-sectional view showing a plasma etching apparatus according to an embodiment of the present invention.

As shown in FIG. 1, a plasma etching apparatus 1 according to an embodiment of the present invention, for processing a semiconductor wafer, comprises a substantially cylindrical and airtight process chamber 2 formed of a conductive material, e.g., aluminum. A lower electrode 4, which can be driven upward and downward by a servo motor 3, is provided in a lower portion of the process chamber 2. The lower electrode 4 serves as a work table on which a round wafer W is to be mounted. A bellows 5, which can be extended or contracted in accordance with the up/down movement of the lower electrode 4, is arranged around the lower electrode 4. The bellows 5 is formed of a corrosion resisting material such as stainless steel and keeps the process chamber 2 airtight.

A refrigerant container (e.g., a cooling jacket 6) for circulating a refrigerant (e.g., chiller) is arranged in the lower electrode 4. The cooling jacket 6 is connected to a supply/exhaust path 7 for supplying and exhausting the chiller. A heater 8 is also arranged in the lower electrode 4. The heater 8 is connected through a lead line 9 to a power supply 10 for supplying power to the heater 8. The lower electrode 4 can be set to a predetermined temperature, for example, 20° C. or lower, by means of the heater 8 and the refrigerant contained in the cooling jacket 6.

Figure 2:
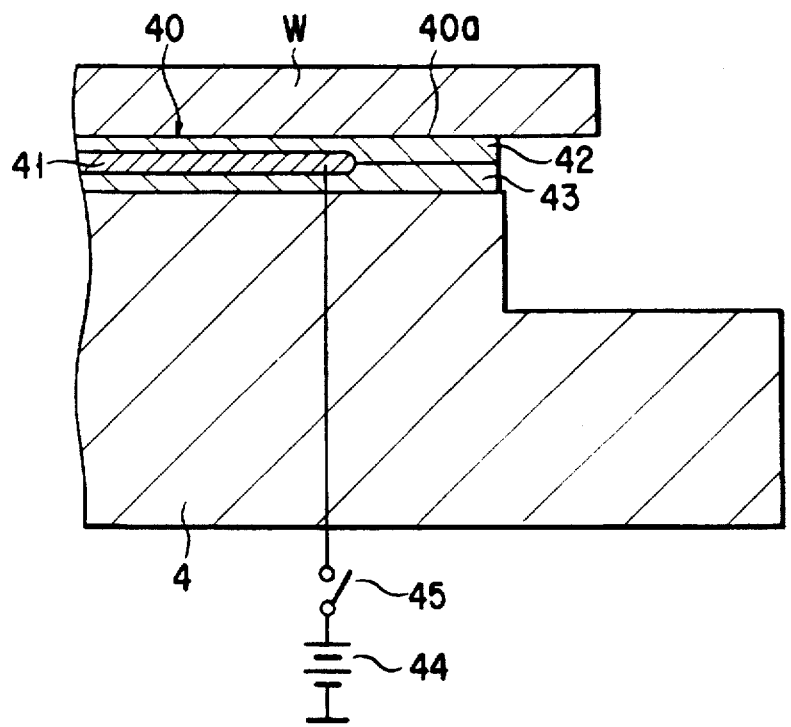
FIG. 2 is a cross-sectional view showing part of an electrostatic chuck of the apparatus shown in FIG. 1.

The lower electrode 4 is formed of a conductive material, such as aluminum coated with alumite. An electrostatic chuck 40, for attracting and holding a wafer W by Coulomb force, is mounted on an upper surface of the lower electrode 4. As shown in FIG. 2, the electrostatic chuck has two dielectric polymer films 42 and 43 and a conductive film 41 (e.g., copper foil) inserted therebetween. The upper surface of the electrode 4 and a wafer supporting surface 40a of the electrostatic chuck 40 have horizontal outlines smaller than that of the wafer W. The horizontal outline of the supporting surface 40a is located within the horizontal outline of the wafer W, when the wafer w is mounted on the supporting surface 40a. The conductive film 41 is connected to a DC power supply 44 through switching means, e.g., an electromagnetic switch 45. The switch 45 is closed, when the power supply 44 is turned on. At this time, static electricity is generated on the surface of the film 42 due to polarization, with the result that the wafer W is attracted to the supporting surface 40a of the film 42 by the Coulomb force.

The lower electrode 4 has, for example, three through holes 12, in which lifter pins 13 are inserted. The lifter pins 13 are connected to an air cylinder 15 through a connector 14 and movable upward and downward. The wafer W is supported on the lifter pins 13 and mounted on or removed from the wafer supporting surface 40a of the electrostatic chuck 40 in accordance with the up/down movement of the air cylinder 15.

A high-frequency power supply 31 of, for example, 13.56 MHz or 40 MHz, is connected to the lower electrode 4 through a blocking capacitor 30. The high-frequency power supply 31 is turned on or off in accordance with instructions from a controller 32. The controller 32 can accumulate and sum up ON time periods in which the high-frequency power supply 31 is on.

A vacuum pump 17 is connected to the bottom of the process chamber 2 through an exhaust pipe 16. The interior of the process chamber 2 can be set to a desired vacuum atmosphere by means of the vacuum pump 17.

A ring 18 is arranged above the lower electrode 4 for covering a marginal portion of the wafer W, being out of contact therewith. The ring 18 is connected to an air cylinder 20, arranged above the process chamber 2, via a plurality of (e.g., four) shafts 19 formed of high purity alumina, so that it can be moved upward and downward.

The outer diameter of the ring 18 is much greater than that of the wafer W. The ring 18 is arranged so that its outer and inner circumferences are coaxial with the wafer supporting surface 40a and the wafer W mounted thereon. That portion of the ring 18 which faces the wafer W (i.e., the periphery of a ring opening 18a) forms a hood 21 recessed upward and coaxial with the outer and inner circumferences of the ring 18. As shown in hood 21 has an inclined wall 21a and a flange 22 protruding inward and including a horizontal lower surfaces 22a. No hole is formed in the hood 21, so that the areas above and under the hood 21 are entirely isolated from each other.

The flange 22 protruding inward entirely covers the marginal portion of the wafer W, mounted on the wafer supporting surface 40a, at a constant distance D1 from the edge of the wafer W. In general, the distance D1 corresponds to the width of the marginal portion of the wafer, from which a photoresist film has been removed in a marginal exposure process prior to the plasma etching process. The distance D1 can be set to a desired value within a range of 0.1 mm to 20 mm, depending on conditions of the process. The hood 21 including the flange 22 has a function of preventing the marginal portion of the wafer W from being etched by plasma. Therefore, where a wafer having an orientation flat is processed, the opening 18a and the hood 21 are formed to have a linear portion corresponding to the orientation flat.

The ring 8 is preferably formed of a dielectric material such as aluminum nitride, alumina or quartz. If the ring 18 is formed of the dielectric material, deposition of a by-product on the ring 18 can be suppressed. The material of the ring 18, however, is selected depending on the kind of reaction gas. For example, when a chlorine-containing gas is used as the reaction gas, it is preferable that the ring is formed of a material (e.g., alumina, quartz or aluminum nitride) which does not react with the chlorine-containing gas, rather than an Si-containing material (e.g., Si or SiC) which reacts with the chlorine-containing gas. On the other hand, when a fluorine-containing gas is used as the reaction gas, it is preferable that the ring is formed of an Si-containing material, such as Si or SiC.

An upper electrode 24, opposing to the lower electrode 4, is arranged above the ring 18. An opposing plate 25, formed of a conductive material such as amorphous carbon, is attached to a lower surface of the upper electrode 24. A bore 26 is formed at the back of the opposing plate 25 in order to hold a process gas. The bore 26 is connected to a gas supply pipe 27 for supplying $CHF_3$ gas, $CF_4$ gas or inert gas such as $N_2$ or Ar gas. A plurality of baffle plates 23 having a number of through holes are arranged in the bore 26. The gas supplied through the gas supply pipe 27 is uniformly diffused by means of the baffle plates 28 and supplied to the reaction chamber 2 through a number of through holes 29 formed in the opposing plate 25. The upper electrode 24 is grounded. When high-frequency power is supplied from the power supply 31 to the lower electrode 3, plasma of the reaction gas can be generated between the electrodes 4 and 24.

An operation of the plasma etching apparatus 1 will now be described.

Prior to the process in the etching apparatus 1, the wafer W is subjected to a marginal exposure process, in which a photoresist film is removed from the marginal portion of the wafer. For example, to etch an $SiO_2$ film 52 formed on the main surface of an Si wafer 50 as shown in FIG. 4 by anisotropic etching, a photoresist film 54 is first applied to the entire surface of the $SiO_2$ film. Next, the wafer W is exposed using an exposure mask (not shown) and developed, so that part of the resist film 54 is removed in accordance with a region 56 to be etched. As a result, a resist film patterned as an etching mask film is formed. Thereafter, the wafer W is subjected to the marginal exposure process, i.e., it is exposed using another exposure mask (not shown) and developed, so that part of the resist film 54 corresponding to a marginal portion 58 is removed. As a result, the $SiO_2$ film in the marginal portion 58 is uncovered.

Subsequently, as shown n FIG. 1, the pressure of the process chamber 2 of the etching apparatus 1 is reduced by means of the vacuum pump 17 to a predetermined pressure, for example, $10^{-3}$ Torr or lower. The wafer W having the uncovered marginal portion 58 is mounted on the lifter pins 13, with the main surface thereof directed upward. Then, the lifter pin 13 are moved down by the air cylinder 15, so that the wafer W is placed on the wafer supporting surface 40a of the electrostatic chuck 40. Then, the DC power supply 44 is turned on and the electromagnetic switch 45 is closed, thereby attracting the wafer W to the wafer supporting surface 40a.

Figure 3:
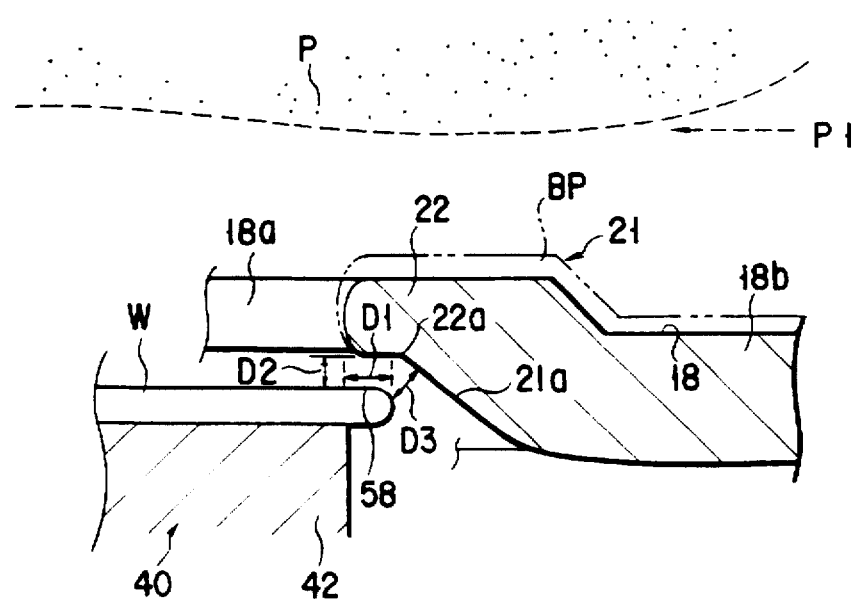
FIG. 3 is a diagram for explaining a function of a hood provided in a ring of the apparatus shown in FIG. 1.

Thereafter, the lower electrode 4 is moved upward and then stopped at a predetermined position where the wafer W and the ring 18 are spaced apart. At this time, as shown in FIG. 3, the marginal portion 58 of the wafer w is covered by the hood 21 in a non-contact state. The flange 22 faces the marginal portion 58 at a distance D2. The inclined wall 21a faces the edge or the side of the wafer W at a distance D3. The distances D2 and D3 are set to small values, such that radicals in the plasma do not easily affect the marginal portion 58 of the wafer W due to the hood 21. The distances D2 and D3 can be set to desired values within a range of 0.3 mm to 25 mm, depending on conditions of the process. The distances D2 and D3 can be changed by moving the ring 18 upward or downward by means of the cylinder 20.

Subsequently, as shown in FIG. 1, the process chamber 2 is exhausted to a predetermined degree of vacuum, or example, several tens of mTorr, while a predetermined process gas is supplied to the chamber through the gas supply pipe 27. Then, the high-frequency power supply 31 is turned on by an instruction signal from the controller 32, so that a high-frequency power of 200 W or greater is applied across the lower electrode 4 and the upper electrode 24. As a result, plasma of the process gas is generated between the electrodes 4 and 24. The wafer is etched by using the plasma. The plasma P is generated so that a plasma sheath P1, i.e., the boundary of the generated plasma, is located above the wafer W.

In the etching process, as shown in FIG. 3, the marginal portion 58 of the wafer W is covered by the hood 21 including the flange 22 and the inclined wall 21a in a non-contact state. The hood 21 is located under the plasma sheath P1 so as not to be brought into contact with the sheath. The hood 21 prevents both a physical etching action due to collision of ions in the plasma P with the marginal portion 58 and a chemical etching action of the radicals in the plasma P on the marginal portion 58, as follows.

As regards the physical etching action, the upper surface of the flange 22 receives ions from the plasma P, thereby preventing the ions from colliding with the marginal portion 58. Since, in particular, the anisotropic etching as in this embodiment is mostly physical etching by the ions, the distance D1 between the end of the flange 22 and the edge of the wafer W substantially determines the protected region of the marginal portion 58.

As regards the chemical etching action, since the distance between the marginal portion 58 and the hood 21 is set small, radicals are not easily supplied to an area therebetween. More specifically, since the distance D2 between the marginal portion 58 and the flange 22 is so small that the radicals are prevented from flowing from a central portion of the wafer W to the marginal portion 58. Similarly, the distance D3 is so small that the radicals are prevented from flowing from surroundings to the marginal portion 58.

During the etching process, a by-product BP is deposited on the ring 18, particularly on the flange 22 protruding inward, as indicated by a phantom line in FIG. 3. Since the ring 18 and the marginal portion 58 of the wafer W are not in contact with each other, the by-product BP on the ring 18 does not drop on the wafer W due to vibration or collision caused by the contact.

In a case where the plasma processing apparatus is an etching apparatus but a CVD film-forming apparatus, if the wafer W is brought into contact with the ring 18, films formed on the processed surface of the wafer W and the upper surface of the ring 18 may be continuously grown. In this case, when the wafer W and the ring 18 are removed from each other, the formed on the ring 18 may drop on the wafer W.

In the etching process, if a number of wafers W are successively processed with the by-products adhered to the ring 18, the number of particles adhered to the wafer W near the marginal portion 58 is abruptly increased after the lapse of a certain process time, as shown in FIG. 5. For example, the number of particles of 0.2 μm or greater increases gradually before the lapse of 80 hours. The number of particles increases abruptly in a period of 80 hours to 100 hours and then at a substantially constant rate after the lapse of 100 hours. It is therefore preferable that the elements in the process chamber 2 such as the ring 18 be cleaned within about 100 hours, more preferably 80 hours. The operator can recognize when the cleaning is required, by setting in the controller 32 a reference value of total process time which requires cleaning, and comparing the reference value with the accumulated periods of time, e.g., during which the high-frequency power is applied.

Figure 6:
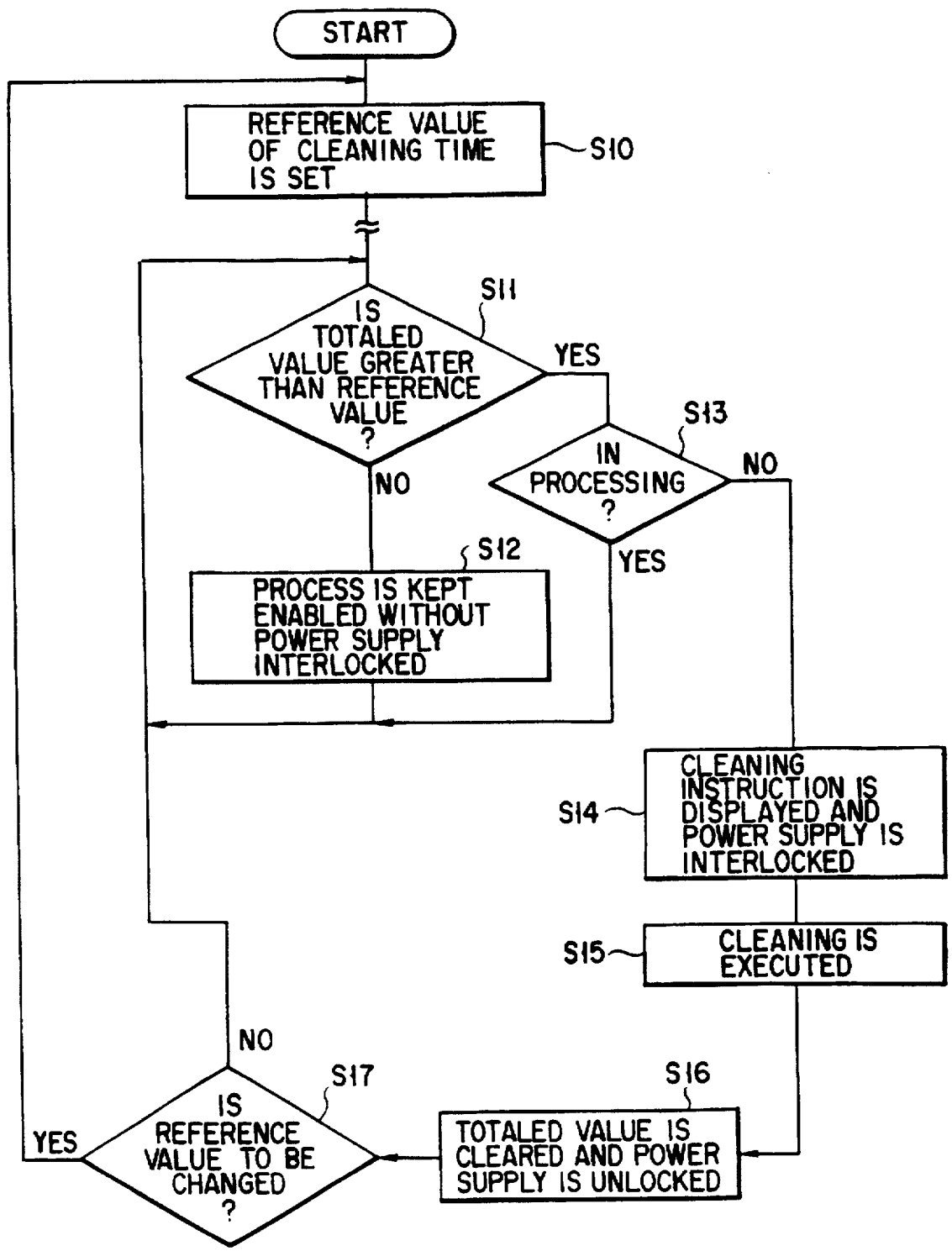
FIG. 6 is a flowchart showing a program for a cleaning process, using a controller.

A program for executing cleaning by use of the controller 32 Will be described with reference to the flowchart shown in FIG. 6.

First, a period of time when the number of particles of 0.2 μm or greater begins to influence the yield of the wafers W, for example, a period of 80 hours is set to the controller 32 as a reference value of a total process time (step S10). This setting is executed by inputting the time through a keyboard 47 of a control panel 46 (see FIG. 1).

Then, a plurality of periods of time, in each of which one wafer W is processed, are accumulated by the controller 32. The last totaled value of time of the process periods stored in the controller 32 has been initialized at the last cleaning. The high-frequency power supply 31 is turned on and off in accordance with the process of the wafers W, and the controller 32 accumulates and sums up the ON time only. The controller 32 compares the totaled value of time with the aforementioned reference value frequently (S11).

If the totaled value is smaller than the reference value, the high-frequency power supply 31 is not interlocked, so as to maintain the state in which the next wafer W can be etched (step S12). The flow of sequence is then returned to step S11.

If the totaled value is greater than the reference value, it is determined whether the wafer W is being processed (step S13). If the wafer W is being processed, the flow of sequence is returned to step S11. The high-frequency power supply 31 is not interlocked if it is determined that the wafer W is being processed in step S13, so as not to interrupt the process of the wafer in order to prevent the wafer W in processing from damage.

If the wafer is not being processed, i.e., if the wafer W is being transferred or the apparatus is idled before or after process, the controller 32 transmits a signal to the display 48 of the control panel 46, so that an instruction to clean the elements in the process chamber 2 is displayed on the display 48. In addition, the high-frequency power supply 31 is interlocked so as not to be turned on (step S14). Based on the instruction displayed on the display 48 of the control panel 46, the operator can clean the ring 18 having the hood 21 and the other members in the process chamber 2 (step S15).

When the ring 18 is cleaned, the by-product BP adhered to the ring is scraped by a grinding member. The grinding member has substantially the same hardness as that of the ring 18 so as not to damage the ring 18 itself. After the by-product BP is removed by the grinding member, the ring 18 is washed with a detergent, e.g., alcohol.

In parallel with cleaning, the totaled value of time of process periods, in which the high-frequency power is applied, stored in the controller 32, is initiated and the interlock of the high-frequency power supply 31 is released (step S16), by using the keyboard 47 of the control panel 46.

Subsequently, it is determined whether the reference value of the total process time, which requires cleaning, is to be changed or not (step S17). If the reference value is to be changed, the flow of sequence is returned to step S10. If not, the flow is returned to S11.

In the manner as described above, it is possible to know accurately when the members (e.g., the ring 18) in the process chamber should be cleaned, on the basis of the totaled value of time of process periods in which the high-frequency power is applied. Consequently, the cleaning can be ensured and the etching yield can be improved.

In the above description, the present invention is applied to a process of semiconductor wafers. However, the present invention can also be applied to a process of other objects, in which case the shape of the hood 21 need be altered in accordance with the shape of the objects to be processed. For example, if an LCD substrate is to be processed, a rectangular hood 21 will be generally used. Further, in the above description, the processing apparatus performs an anisotropic etching with a high-frequency power applied to the lower electrode. However, it is possible the apparatus performs an isotropic etching (anode-couple type) with a high-frequency power applied to the upper electrode. The present invention is applicable to any apparatus using plasma, for example, an ashing apparatus and a CVD film-forming apparatus, as well as the etching apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for subjecting a substrate to a plasma process, the substrate having a portion on which a patterned mask film is formed and a marginal portion which is not covered with the mask film, said apparatus comprising:
   a process chamber;
   a supply for supplying a process gas to the process chamber;
   an exhaust means for exhausting and setting the process chamber to a vacuum;
   a work table arranged in the process chamber, and having a supporting surface for mounting the substrate, and an electrostatic chuck for attracting and holding the substrate on the supporting surface;
   a plasma generator for making the process gas into a plasma at a position facing the supporting surface and in the process chamber, the plasma having a plasma sheath opposite to the supporting surface; and
   a hood arranged between the substrate mounted on the supporting surface and the plasma sheath, the hood covering but being out of contact with a marginal portion of the substrate so as to prevent the marginal portion from being subjected to the plasma process.

2. The apparatus according to claim 1, wherein the hood is formed of dielectric material.

3. The apparatus according to claim 2, further comprising an elevating mechanism for causing the supporting surface and the hood to approach and separate from each other, so as to adjust a distance between the supporting surface and the hood.

4. The apparatus according to claim 3, wherein the hood comprises an inward flange facing the marginal portion, the flange extending from an edge of the substrate by 0.1 to 20 mm and being spaced apart from the marginal portion at a distance of 0.3 to 25 mm.

5. The apparatus according to claim 4, wherein the supporting surface has a horizontal outline smaller than that of the substrate, and the horizontal outline of the supporting surface is located inside that of the substrate, when the substrate is mounted on the supporting surface.

6. The apparatus according to claim 5, wherein the hood comprises a side wall formed continuously with the flange, facing to the edge of the substrate, the side wall crossing a plane on which the marginal portion is located.

7. The apparatus according to claim 5, wherein the supply supplies an etching gas as the process gas.

8. The apparatus according to claim 6, wherein the plasma generator comprises first and second electrodes facing each other and a power supply for applying a high-frequency power between the first and second electrodes, the second electrode serving as the work table.

9. The apparatus according to claim 8, wherein the elevating mechanism comprises members for independently moving the second electrode and the hood, respectively.

10. The apparatus according to claim 9, wherein the supply supplies the etching gas to the process chamber through a number of holes formed in the first electrode.

11. An apparatus for subjecting a substrate to a plasma process, the substrate having a portion on which a patterned mask film is formed, said apparatus comprising:
   a process chamber;
   a supply for supplying a process gas to the process chamber;
   an exhaust means for exhausting and setting the process chamber to a vacuum;
   a work table, arranged in the process chamber, having a supporting surface on which the substrate is mounted and an electrostatic chuck for attracting and holding the substrate on the supporting surface;

a plasma generator for making the process gas into a plasma at a position facing the supporting surface and in the process chamber; and a hood facing the substrate mounted on the supporting surface, the hood covering but being out of contact with a marginal portion of the substrate at a distance of 0.3 to 25 mm so as to prevent the marginal portion from being subjected to the plasma process.

12. The apparatus according to claim 11, wherein said hood faces said marginal portion of the substrate, which is not covered with the mask film.

13. The apparatus according to claim 11, wherein said plasma generator generates said plasma, which has a plasma sheath facing the supporting surface, and said hood is arranged between the substrate mounted on the supporting surface and the plasma sheath.

* * * * *

UNITED STATES PATENT AND TRADEMARK OFFICE
CERTIFICATE OF CORRECTION

| | |
|---|---|
| PATENT NO. | : 5,779,803 |
| DATED | : July 14, 1998 |
| INVENTOR(S) | : Yoichi Kurono et al. |

Page 1 of 1

It is certified that error appears in the above-identified patent and that said Letters Patent is hereby corrected as shown below:

<u>Title page,</u>
Item [73], Assignee data should read as follows:

-- [73]  Assignee: Tokyo Electron Limited, Tokyo, Japan --

Signed and Sealed this

Fifteenth Day of January, 2002

Attest:

JAMES E. ROGAN
*Attesting Officer*   *Director of the United States Patent and Trademark Office*